(12) United States Patent
Russell (10) Patent No.: US 8,046,648 B1
(45) Date of Patent: Oct. 25, 2011

(54) METHOD AND APPARATUS FOR CONTROLLING OPERATING MODES OF AN ELECTRONIC DEVICE

(76) Inventor: Robert J. Russell, South Boston, MA (US)

( * ) Notice: Subject to any disclaimer, the term of this patent is extended or adjusted under 35 U.S.C. 154(b) by 69 days.

(21) Appl. No.: 11/761,815

(22) Filed: Jun. 12, 2007

Related U.S. Application Data

(60) Provisional application No. 60/813,134, filed on Jun. 12, 2006, provisional application No. 60/814,133, filed on Jun. 17, 2006, provisional application No. 60/864,406, filed on Nov. 5, 2006.

(51) Int. Cl.
*G01R 31/28* (2006.01)
(52) U.S. Cl. .................. 714/726; 714/724; 714/727
(58) Field of Classification Search .................. None
See application file for complete search history.

(56) References Cited

U.S. PATENT DOCUMENTS

| | | | | |
|---|---|---|---|---|
| 4,566,104 A | * | 1/1986 | Bradshaw et al. ............ | 714/726 |
| 5,155,704 A | * | 10/1992 | Walther et al. ............... | 365/201 |
| 6,256,761 B1 | * | 7/2001 | Deix et al. .................... | 714/727 |
| 7,372,760 B2 | * | 5/2008 | Nagatomi et al. ............ | 365/226 |
| 2003/0212939 A1 | * | 11/2003 | Baker ........................... | 714/724 |

OTHER PUBLICATIONS

IEEE Std 1149.1-1990 Standard Test Access Port and Boundary-Scan Architecture.*

* cited by examiner

*Primary Examiner* — Jeffrey A Gaffin
*Assistant Examiner* — Steve Nguyen (57) ABSTRACT

A method and apparatus allows controlling a plurality of test operations in an electronic device, and in particular a volatile or non-volatile memory device in which a test mode has already been established, without the need for additional device connections. One such operation may be switching device operation from test mode to functional mode, the normal operating mode of the device. Other test operations include support of continuity testing by external circuitry, support of externally accessing device identification with which the device has been previously programmed, support of built in self-test, support of self-repair and support of other operations determined as needs arise.

16 Claims, 8 Drawing Sheets

```
                                                              433
CS*  A00      A07    A13     SINGLE STEP COMMANDS 0   1XXXXXXXXXXXXX  ⎤
     X1XXXXXXXXXXXX  ⎥
     XX1XXXXXXXXXXX  ⎬   INTERCONNECT
     XXX0XXXXXXXXXX  ⎥   TEST
     XXXX0XXXXXXXXX  ⎥
     XXXXX0XXXXXXXX  ⎦

000111X0XXXXXX
     ⎣___⎦
           A07      A13    MULTI-STEP COMMANDS

G000000         END TEST MODE
           G000001         STOP BIST, OUTPUT RESULTS
           G000010         START BIST, SHORT
           G000011         START BIST, LONG
           G000100         OUTPUT BIST ERROR ADDR H
           G000101         OUTPUT BIST ERROR ADDR L

G000111         IGNORE END TEST STIMULUS

G010000         WRITE LOCATION - DATA
           G010001         WRITE LOCATION - ADDR H
           G010010         WRITE LOCATION - ADDR L

G010100         READ LOCATION - DATA
           G010101         READ LOCATION - ADDR H
           G010110         READ LOCATION - ADDR L

G011000         REACTIVATE TIMER BYTE H
           G011001         REACTIVATE TIMER BYTE L

G011100         REACTIVATE AFTER - DATA
           G011101         REACTIVATE AFTER - ADDR H
           G011110         REACTIVATE AFTER - ADDR L

G100000         ACTIVATE REPAIR GROUP 0
           G100001         DEACTIVATE REPAIR GROUP 0
           G100010         REPORT GROUP 0 ADDR
           G1000XX         RFU GROUP 0

G1111XX         RFU GROUP 7
```

370 (left marker), 437 (right marker), 439 (bottom marker)

METHOD AND APPARATUS FOR CONTROLLING OPERATING MODES OF AN ELECTRONIC DEVICE

CROSS-REFERENCE TO RELATED APPLICATIONS/DOCUMENTS

The present application is related to the U.S. non-provisional patent application bearing application Ser. No. 11/222,474 filed Sep. 7, 2005, titled "Method and Apparatus for Enabling and Disabling a Test Mode of Operation of an Electronic Memory Device without Additional Interconnects or Commands" published Mar. 9, 2006 as Publication number 20060053358, issued as U.S. Pat. No. 7,584,384 on Sep. 1, 2009. The present application claims priority of the following U.S. provisional applications: U.S. provisional application 60/813,134 titled "Method and Apparatus for Controlling Operating Modes of an Electronic Device" filed Jun. 12, 2006; U.S. provisional application 60/814,133 titled "Method and Apparatus for Controlling Operating Modes of an Electronic Device" filed Jun. 17, 2006 and U.S. provisional application 60/864,406 titled "Method and Apparatus for Controlling Operating Modes of an Electronic Device" filed Nov. 5, 2006. Also, the present application claims priority of earlier filed U.S. disclosure document 602,438 titled "Method and Apparatus for Controlling Operating Modes of an Electronic Device—Additions" filed Jun. 20, 2006. This application incorporates by reference the above referenced U.S. provisional applications and disclosure document. The White Paper of the IEEE P1581 Working Group dated Jan. 3, 2007 is also incorporated by reference. This document is available at the P1581 Working Group website, URL: http://grouper.ieee.org/groups/1581/documents/P1581_White_Paper_a20070103.pdf

BACKGROUND OF THE INVENTION

1. Field of Use

The present invention relates to field of electronic testing and, in particular, to the testing of printed circuit boards (PCBs) and to writable memory devices, volatile or non-volatile, and other devices that may be mounted thereon. The invention more particularly relates to testing for proper connections to other parts of the PCB, testing for and accessing device identification data contained within the devices and for controlling built-in self test (BIST) and self-repair of those devices.

2. Related Art

The benefits of being able to test for proper connection between the various devices mounted on PCBs has long been recognized as beneficial both in fault detection and diagnosis. That is, while testing the PCB as a functional unit is important in itself, there are advantages to separately testing the interconnects, especially in PCB designs in which the functionality is complex. Such designs are sometimes referred to as being comprised of random logic, because the challenge of testing differs from that of more straightforward designs, such as is the case with, for example, main memory units. In the latter type, the same or similar clusters of logical functions may exist in, perhaps, over a hundred instances. Additionally, these clusters of logical functions may be the same or similar to those functions which have existed in digital computers for decades and for which tests have been developed and perfected over time.

Various methods have been developed to address the testing challenges of interconnect testing. One such method is termed "boundary scan," where a secondary layer of logic (test logic) is added to the primary layer of logic (functional logic) of each boundary scan device and controlled by extra connections to the device. IEEE Standard 1149.1 defines a method of boundary scan widely used in the industry. IEEE Standard 1149.1 was developed as a refinement of an international industry effort termed "Joint Test Action Group" (JTAG). Presently, the term JTAG is also used to refer both to devices which are IEEE Standard 1149.1 compliant and devices which may not be in strict compliance to the standard. The term IEEE 1149.1 will be used herein to include both classes of devices (i.e., strictly compliant and not strictly compliant).

IEEE 1149.1 devices incorporate three or four extra test input connections (TDI, TCK, TMS or TDI, TCK, TMS, TRST*, respectively) to control the internal device test logic. Such a device operates in either a functional mode or a test mode, depending on the signals received at those test input connections and upon the time interval since the device was powered up. That is, it is a norm that IEEE 1149.1 devices with only the three extra test inputs are designed to achieve a completely functional (non-test) state within a given interval after power up. It should be noted that the term "state of a device" is used herein to refer to which logical layer is controlling the non-IEEE 1149.1 outputs of the device. That is, in the test state, the boundary scan layer controls most device outputs, whereas in the functional device state, the functional logic layer controls most device outputs. An exception is the single IEEE 1149.1 output connection (TDO), which is always controlled by the test logic. Most non-IEEE 1149.1 input connections are usually connected to the test logic for level sensing. Exceptions may be power and high-speed clock inputs. The extra IEEE 1149.1 connections (TDO, TDI, TCK, TMS and optional TRST*) are termed a "Test Access Port."

While the IEEE 1149.1 capability has been included on many complex devices, such as microprocessors and the like, many simple devices, such as separate groups of AND or OR gates, for example, are not available in IEEE 1149.1 versions. In the case of such simple devices, the added IEEE 1149.1 logic might be more complex than the functional logic of the device. Also, the simple logic paths that these devices provide between more complex devices are often easily testable by means of the IEEE 1149.1 circuitry extant in those complex devices and automatic test pattern generation (ATPG) software commonly used to write IEEE 1149.1 test patterns. The decision not to include IEEE 1149.1 logic in a device is made by the device manufacturer, as a marketing choice. That is, for example, the manufacturer decides whether or not the additional cost of an IEEE 1149.1 version of a device will be sufficiently welcomed in the market.

Memory devices have largely fallen into the category of devices which do not incorporate IEEE 1149.1 circuitry. Reasons for manufacturer decisions not to include IEEE 1149.1 may be the extremely competitive nature of the memory device industry, the inherent propagation delay, however minor, of adding any circuitry to the functional connections and the PCB etch routing problems imposed by the IEEE 1149.1 interconnects. There may be other reasons, as well, including what may possibly be the main reason manufacturers do not include IEEE 1149.1 circuitry on most memory devices: the nature of PCB designs incorporating one or more clusters of those devices. A main memory PCB of a computer is an example of a cluster of memory devices. In some key respects, the designs of clusters of memory devices are very similar to those of the past and can be tested by test programs very similar to those developed over decades. These test programs generally have high fault detection and fault diagnosis capabilities. Hence, there is less overall economic advantage to be gained by adding IEEE 1149.1 circuitry to memory devices in comparison to adding it to microprocessors, for example, by the device manufacturer.

In memory device applications other than clustered applications, interconnect testing is often extremely difficult. That is, unless the memory device contains IEEE 1149.1 circuitry, its connection to one or more devices which do may not solve the test problem. For example, in a case where the memory device operation has timing requirements which cannot be met by boundary scan operations, such testing may be impossible. To address such problems, another standard has been proposed, IEEE Standard P1581 (hereinafter referred to as IEEE P1581). As with IEEE 1149.1, an IEEE P1581 device would have both a test mode and a functional mode. However, the circuitry used in the IEEE P1581 test mode would be much less complex than the circuitry required for IEEE 1149.1. The circuitry may be simple gates such as AND, NAND, OR, NOR, XOR and XNOR, connected between device inputs and outputs in predetermined patterns, although more complex logic functions, such as storage elements, are not precluded from use. These logic functions enable signals from IEEE 1149.1 circuitry in another device or devices to propagate through the memory device and stimulate inputs of the same or other IEEE 1149.1 devices. The use of simple gating in IEEE P1581 means there is a minimum of extra circuitry involved in the memory devices, although the economy of circuitry has little apparent relative effect on the cost of device fabrication because of the small size of either type of test circuit (i.e., IEEE 1149.1 vs. IEEE P1581) in comparison to the functional circuitry of a memory of substantial size. The principal benefit of IEEE P1581 as originally proposed, absent the benefit of the invention of the cross referenced related application, is that only one extra connection to the device is needed to select test mode or functional mode. In certain memory devices, there may even be one or more combinations of control input signals which serve no functional purpose. In such instances, one or more such control input signal combinations may be used to set or reset the test mode, obviating extra connections. Memory devices having such unused control input signal combinations, however, are the exception rather than the rule. Therefore, incorporating the originally proposed IEEE P1581 capability into a device will commonly require an otherwise unnecessary connection to the device. Even this single added connection will sometimes be considered by suppliers as presenting a marketing disadvantage in main memory applications, which represents the largest market for many memory devices and where, as stated, the test advantage of IEEE P1581 is somewhat diminished because of the availability of adequate test methods which work well without the IEEE P1581 test circuitry.

The ability to externally access and read the contents of a read-only register within a device which is programmed during device manufacture with a thereafter unalterable code is also considered very beneficial. When included in the device, this capability may represent the only means by which important variations in the basic design of a device may be detected in a practical way during test operations once the device manufacturing process is complete and, to an even greater extent, when the device has been connected to other devices on a PCB. An example of such a register is the 32-bit Device Identification Register included in IEEE 1149.1 devices, although non-IEEE 1149.1 identification schemes involving lesser or greater numbers of bits may be used to advantage.

The benefits of BIST and self-repair have also long been recognized. BIST may be conveniently controlled by means of the IEEE 1149.1 test access port. Self-repair, a method whereby extra sections of a device may be substituted for sections determined to be faulty, either automatically or via external commands, also may utilize the IEEE 1149.1 test access port for convenience. That is, a degree of inconvenience results when BIST and self-repair are controlled by other means. This is usually because extra connections to the device are required, along with other hardware external to the device.

The invention described in the inventor's related patent application, application Ser. No. 11/222,474 filed Sep. 7, 2005, allows operating mode control of volatile memory devices which, by their nature, need have no functional purpose between the application of power and the time data is first written into them. In devices designed according to that invention, test mode begins at power up and ends at the beginning of the first write. That invention does not include a provision for device identification, BIST and self-repair and is of minimal value in non-volatile writable memory applications, where data written prior to the previous power down may need to be accessed before the first write after the current powering up. Also, the inventor's referenced related patent application r may be impractical for use with test equipment having certain pattern application and/or test flow constraints. Additionally, the inventor's referenced related patent application has no provision to return to test mode once functional mode has been invoked without powering the memory device down and then up, an operation which may be impractical, for example, because of additional hardware requirements to do so without cycling power to the entire PCB, or because of additional requirements of either or both of the PCB hardware or test software if the entire PCB is to be powered down and then up.

Since filing the referenced related patent application, the inventor of the present invention has developed a number of methods of test mode entry and exit which, like the related patent application, require no extra device connections. The present invention is best understood when explained in light of these developments, thus, the term "present invention and related test mode control apparatus and methods" is used herein to refer to both the present invention and the stated developments without confusing matter to be claimed as part of the present invention from that which is not. It should be noted that one of the developments includes a means allowing a device designed according to the teachings of the related patent application to return to test mode once functional mode has been invoked. It should further be noted that the related test mode control methods are detailed in the three cross-referenced provisional applications and cross referenced disclosure document, with a single exception (the use of non-logic analog levels, stated previously herein).

Therefore, it is an objective of the present invention to provide a method of controlling a plurality of test operations without the need of extra device connections in an electronic device in which a test mode has already been established.

It is a further objective of the present invention to provide test operation control usable with IEEE P1581 devices which include device identification, BIST and self-repair operations in any combination in addition to IEEE P1581 continuity test operations.

It is a still further objective of the present invention that it be compatible with test equipment having certain pattern or test flow constraints.

It is an even still further objective of the present invention that it permit external access to an internal device register similar to the Device Identification Register of IEEE 1149.1 devices, examination of the contents of which allows practical differentiation between minor variations of the same basic device design, to the extent permitted by register programming during device manufacture.

The description of the IEEE P1581 Proposal, given above, taken with the sections titled "P1581 Concept" and "P1581 Test Gates" beginning on page 2 of the White Paper of the IEEE P1581 Working Group dated Jan. 3, 2007, previously incorporated herein, will hereinafter be termed "Proposed IEEE P1581 Architecture."

The term "digital functional" in describing inputs and outputs may be used hereafter to refer to those device connections which specifically exclude dedicated test connections, power connections and analog connections, including high speed clocks. It is noted that "digital functional" connections referred to herein are sometimes referred to as "system" connections in other documents, such as IEEE Std. 1149.1.

SUMMARY OF THE INVENTION

The above and other objects of the present invention are achieved in an illustrated embodiment of a method and apparatus which may be included as a layer of test logic in a logical device and, in particular, in a logical memory device.

The present invention and related test mode control apparatus and methods take advantage of common PCB design practices. In one such design practice, the signals or combination of signals used to initiate a write to most memory devices are made to be inactive immediately after power up, thus avoiding unwanted data writes. This is especially important when non-volatile memory devices are used, since important data stored before the previous power down might otherwise be randomly overwritten. In a memory device incorporating one variation of the present invention and related test mode control apparatus and methods, write activity is monitored as soon as power up stability has been achieved. If activity is sensed, the test mode is invoked. If no activity is sensed, the functional mode is invoked and the test mode is prevented from occurring until the next power up occurs. Thus, in the latter case, the PCB and test designers may determine to utilize the memory device in what is sometimes termed "legacy" operating mode: the memory operates in the manner of an equivalent device, but absent the test capability. To invoke the test mode at power up, the PCB and/or test designer need only ensure that an otherwise meaningless write activity occurs.

In another such design practice, PCB address and control signals to a memory device possess certain timing and sequence characteristics during memory operations. For example, the write enable signal to the memory device would never remain active for as long as, say, fifty milliseconds, nor would address lines change state while the write signal was active. In yet another design practice, the clock signal to a memory device requiring such an input from the PCB would always be held to be within a given frequency tolerance. Therefore, one skilled in the art may devise numerous methods to switch between functional and test modes of a memory device without additional device connections. That is, it is simply a matter of choosing an unusual stimulus to be detected within the device, for example a write signal being active for fifty milliseconds, and generating such a signal on or external to the PCB when the mode switch was desired. (In the example given, it is assumed actual completion of the write operation after a mode switch would be a matter of design choice, allowing the mode switch to be carried out without altering device contents.) The generation and detection of analog signal levels outside normal logic signal levels, by PCB circuitry and internal device circuitry, respectively, affords yet another method of controlling test mode without adding extra device connections.

Once the memory device is in test mode, device outputs are controlled by a layer of test logic. The functional layer, the layer that performs the legacy operating mode functions in a device not incorporating the present invention and related test mode control apparatus and methods, is set to ignore external inputs which could inadvertently alter memory contents or otherwise interfere with testing. When the device is in test mode, the functional layer does not control device output drivers, other than indirectly in some optional test operations which may be used to examine the logic of the functional layer.

The layer of test logic may include sections to support (1) IEEE P1581 or similar continuity functions, (2) device identification functions, (3) BIST functions or (4) self-repair functions. Other sections may also be included as needs arise. The various functions are selected by commands received at device inputs specified according to the teachings of the present invention and related test mode control apparatus and methods. In memory devices, these device inputs include address, data and control. While all address and data inputs and outputs have been considered to be required for continuity functions, the present invention and related test mode control apparatus and methods utilize input combinations which can be considered superfluous for continuity test purposes as command codes and data for non-continuity test purposes. That is, a subset of all possible input combinations suffices for use in detecting and diagnosing continuity faults. The remaining combinations may be considered superfluous and available for use in controlling BIST, self repair, remotely detected device identification and other functions.

Other command functions which may be included are those necessary for deactivating test mode and activating normal device functionality and, optionally, those that will cause a reversal of that action at a predetermined time or with predetermined external stimulus. Thus, the present invention and related test mode control apparatus and methods allow for a great deal of flexibility in PCB and/or test designer selection of test program execution and equipment, including the ability to ignore the test capability of the present invention and related test mode control apparatus and methods for practical purposes and operate the device in legacy mode.

The present invention and related test mode control apparatus and methods are usable with devices designed according to the inventor's referenced related patent application to the extent of using superfluous input combinations to in performing device identification, BIST and self-repair functions. The methods of the previous invention of activating and deactivating test mode would not be altered. In particular, commands to end test mode and define its reactivation would not be utilized in devices designed according to the invention of the inventor's referenced related patent application.

It should be noted that the term "layer" has been used herein for ease in distinguishing between the test and functional logical sections of a device and not to suggest a limitation imposed by the present invention and related test mode control apparatus and methods on the physical design and manufacturing process of the device.

It should be further noted that the stated applicability of the present invention and related test mode control apparatus and methods to volatile or non-volatile memory devices is not intended to preclude its applicability to devices having combined volatile and non-volatile characteristics.

It should be even further noted that input combinations which cannot be considered superfluous for continuity test purposes could also be used as command codes. This is the case when the activity performed in response to each such command code allows the device output values to depend only on the input values and operation of the continuity test circuitry.

DESCRIPTION AND OPERATION OF THE ILLUSTRATED EMBODIMENT

With reference to FIGS. 1 through 8, the principles of the present invention and related test mode control apparatus and methods will now be described relative to their application to a particular device and system incorporating any chosen method of switching between test and functional modes of operation without extra device connections. For ease of understanding, no distinction will be made in the following description of the present invention and related test mode control apparatus and methods between their applicability to a device mounted on a PCB versus a section of a device contained within a device.

Figure 2:
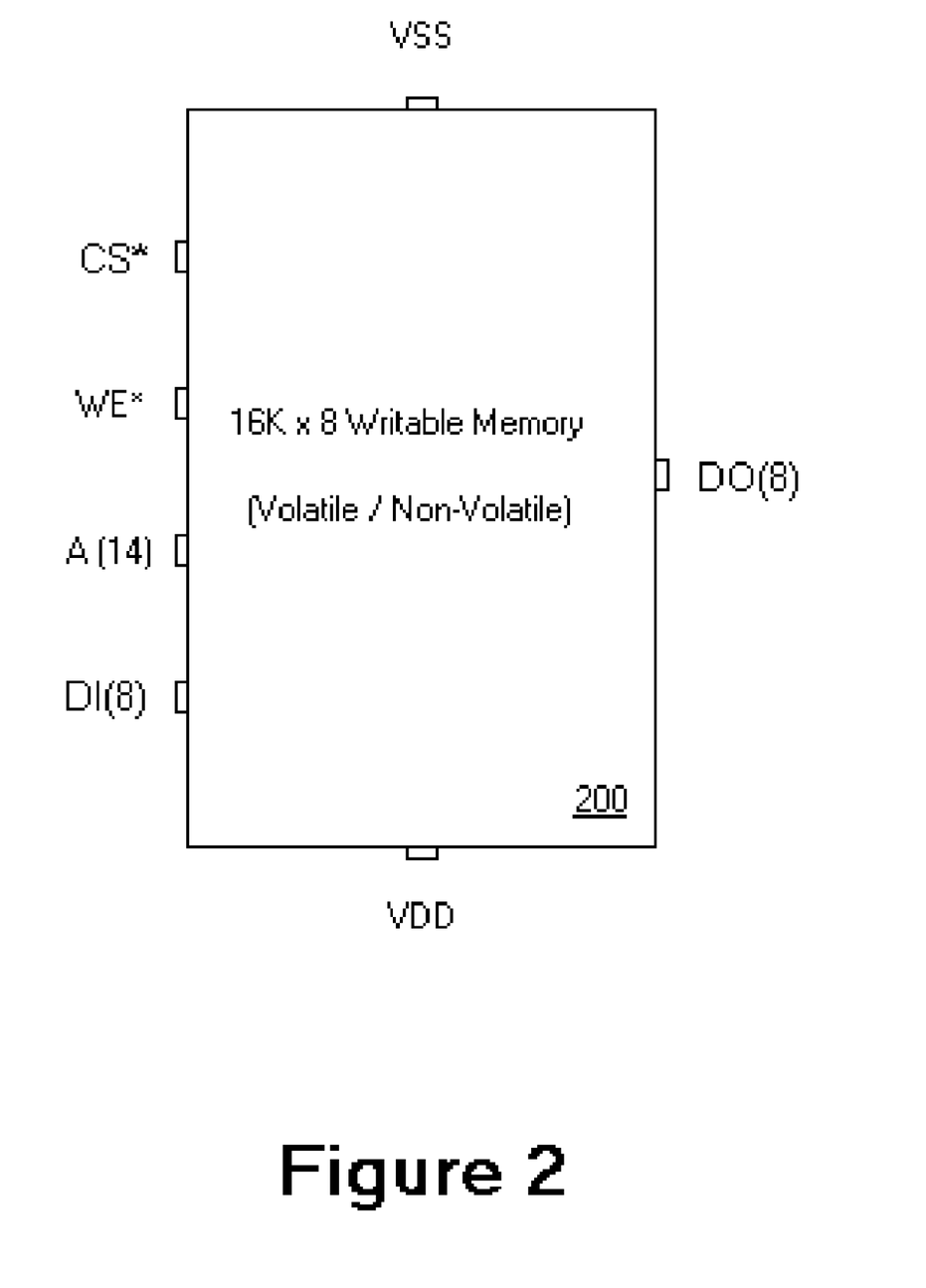
FIG. 2 is a symbolic representation of the memory device of FIG. 3.
Figure 3:
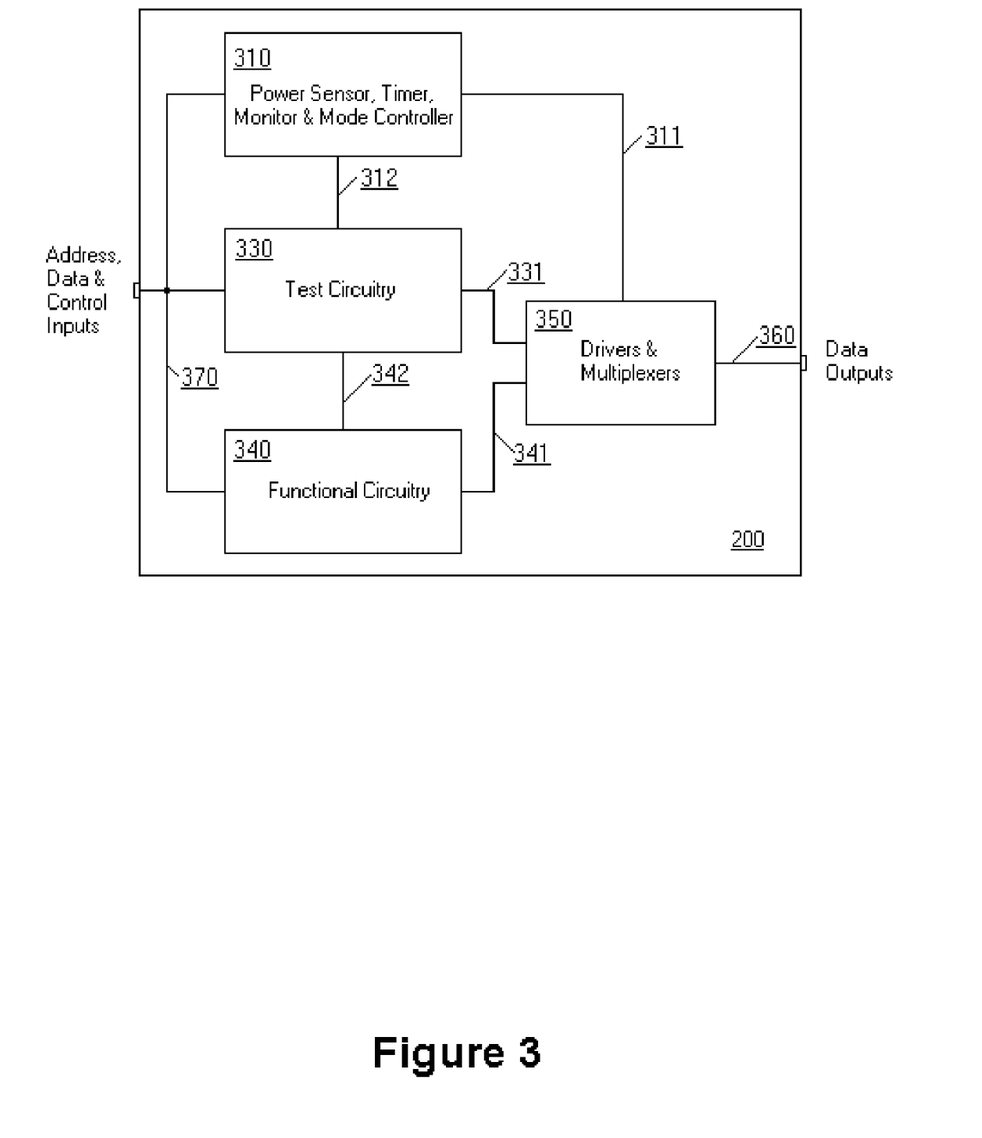
FIG. 3 is a block diagram showing the various sections of a device incorporating the present invention and related test mode control apparatus and methods.

The memory device 200 shown in FIGS. 2 and 3 is a TTL 16,384×8 memory device having 34 connections: CS*, WE*, fourteen address inputs labeled A(14), eight data inputs labeled DI(8), eight data outputs labeled DO(8), and two power connections labeled VSS and VDD. There are no extra connections included to activate or deactivate test mode or functional mode. Also, in functional mode, all possible combinations of logic input states of the memory device have a defined purpose. Therefore, there is no extra state or command available in functional mode which may be used exclusively for test purposes, such as for activating or deactivating test mode without affecting the functional circuitry. Other devices to which the memory device incorporating the present invention and related test mode control apparatus and methods may be connected are not shown in FIGS. 2 and 3.

Memory device 200 is assumed to be non-volatile: data written is retained both in the presence and absence of power. It is important to note that non-volatility of the device is not a requirement for operation with the present invention and related test mode control apparatus and methods, but was chosen for inclusion in this description because it represents the more difficult case. The present invention and related test mode control apparatus and methods are applicable both to volatile and non-volatile devices.

The operation of the functional mode of memory device 200 will now be described in general terms so as to make its operation understandable to those familiar with such devices. The description does not include all details, such as timing details, which might be included in a datasheet of the device but which are not necessary to an understanding of the operation of the present invention and related test mode control apparatus and methods. In the device of FIG. 2, CS* is a negative enabled chip select. When CS* is a logic zero, the outputs are driven and writing to the memory is permitted. When CS* is a logic one, the output drivers are in a high impedance state and writing is prevented. When WE* transcends from a logic zero to a logic one in conjunction with CS* being a logic zero, the data present at the 8 data inputs DI is written into the memory address A present at the 14 address inputs. In functional mode, CS* being low causes the eight outputs DO to be driven with the contents of the memory location selected by the address present at the fourteen A inputs. In test mode, CS* being low causes the outputs to be driven by the test circuitry.

Figure 5:
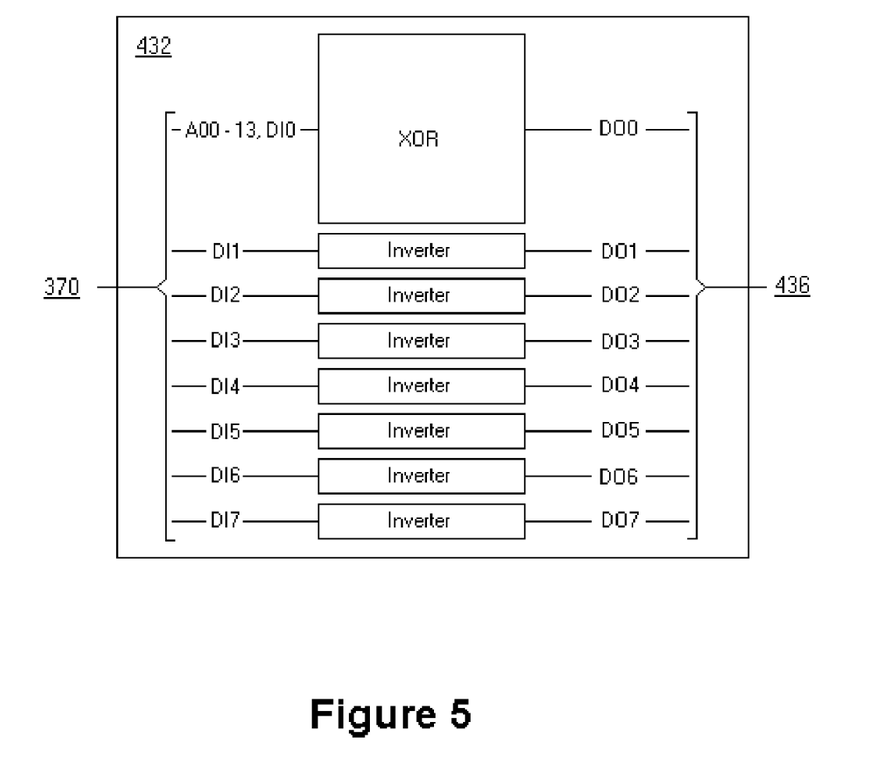
FIG. 5 is a block diagram showing details of interconnect test circuit 432 in FIG. 4.

Although not part of the present invention and related test mode control apparatus and methods, an example of the test circuitry of IEEE P1581 will now be described as an aid to understanding the application of devices incorporating the present invention and related test mode control apparatus and methods. As shown, the memory device 200 has a total of 22 address and data inputs and 8 data outputs. For IEEE P1581 test mode operations, seven of those 22 inputs are passed through inverters before being passed on to seven of the eight output drivers of the memory device 200. The remaining 15 of those 22 inputs are connected to the inputs of a 15 input XOR gate, the output of which is connected to the eighth output driver. FIG. 5 illustrates the connections of that example case. In memory devices having more outputs than inputs, each input is inverted and each output is driven by a unique combination of inverter outputs or sets of inverter outputs passed through an AND gate. In memory devices where the number of inputs equals the number of outputs, each output is uniquely driven by the inversion of one input. Other gating arrangements are possible. For example, in a modified arrangement, using a counter, some of the DO outputs may be driven in patterns which vary according to the number of transitions of CS* or WE* occurring since power up or since other defined conditions whereby the counting circuitry is reset. Thus, by utilizing test features, such as those of IEEE 1149.1, which may be present in the external devices to which memory device 200 is connected, in conjunction with the test circuitry of memory device 200 (during IEEE P1581 test mode operations), relatively simple connectivity test patterns may be applied to and read from memory device 200.

Although also not part of the present invention and related test mode control apparatus and methods, an example of the BIST and self-repair circuitry will now be described as a further aid to understanding the application of devices incorporating the present invention and related test mode control apparatus and methods. The self-repair circuitry includes eight groups of 64 memory locations. Each group is capable of being substituted for a group of 64 cells in the remainder of the memory array. Thus, as many as 512 (8×64) defective locations in the principal section of the memory array may be defective and not cause improper operation of the device as a whole, as long as the self-repair section is properly configured. Configuration of the self-repair section may be accomplished by external commands, detailed later. Further external commands may allow remote examination of the configuration settings of the self-repair section. The BIST section also operates according to commands received externally. In the illustrated embodiment, the commands allow (1) running a relatively short BIST test, (2) running a relatively long BIST test, (3) stopping the BIST test (if still running) and examining a register which stores pass/fail results, (4) examining a register showing the high order byte of the address at which an error may have been found and (5) examining a register showing the low order byte of the address at which an error may have been found. Further details of these commands are provided later. It is important to note that the BIST test may be executed on the memory array as it exists after self-repair operations have been performed. That is, for example, a memory array having a defective section which has undergone successful self-repair will not fail the BIST.

The present invention and related test mode control apparatus and methods are included in memory device 200 in addition to the circuitry necessary for the device to perform its normal function. That is, the additional test circuitry of the device is intended to be utilized only during specific test operations on the PCB. Once the tests have been completed, the additional test circuitry becomes essentially transparent so that the normal functionality of the device exists, for practical purposes, in the same form as a like device absent the test circuitry. An exception to this is self repair circuitry, which continues to substitute for defective functional circuitry, preventing otherwise erroneous operation. Also, the outputs of the device during test mode may be designed to have less than normal drive strength so as to minimize or eliminate possible problems that might exist when numerous such devices are connected together on a bus and the external signals necessary to prevent such conflicts have not been invoked or do not exist. While the application of the present invention and related test mode control apparatus and methods have been described as intended to be as an addition to memory devices, it may be used to benefit in other devices as well to provide testing benefit in certain circumstances.

For purposes of the current explanation, "test mode" refers to a mode of operation where the device outputs are controlled by the test circuitry of the device and where the functional circuitry of the device is controlled only by the test circuitry. That is, the functional circuitry of the device ignores all direct external stimulus when the device is not in "functional mode." Thus, for example, the functional circuitry of device 200, when in test mode, will not, when the input conditions exist to write data D in address A, write data D into address A, as it would if the device had been in functional mode.

It is also important to note that one goal of the present invention and related test mode control apparatus and methods is that a device containing certain alternative implementations of the present invention and related test mode control apparatus and methods does not interfere with the functional operation of a PCB design where the test mode is not utilized. That is, when the PCB designer has chosen not to utilize the test benefits of a device incorporating the present invention and related test mode control apparatus and methods, no special stimulus to the device will be required to prevent the test mode from interfering with PCB operation other than to ensure, for example in the case of the test mode entry method used in FIG. 1, the write function is activated at power up and for a short period thereafter, a normal PCB operating characteristic and one which may usually be easily included when designing a PCB. In some cases, the device designer may prefer to utilize input functions other than or in addition to the write function as the means of causing the device to operate in test mode. That is, the write function or other predetermined combination of input signals may be considered a "test code" for selecting the device operating mode, test or functional, shortly after power up. Thus, a device incorporating the present invention and related test mode control apparatus and methods will be able to be utilized interchangeably in PCBs which utilize the test mode and PCBs which do not.

The method of operation of a device incorporating the present invention and related test mode control apparatus and methods included on a PCB which has not been designed to take advantage of the test mode will now be described with reference to FIG. 1. The power off state of the PCB and the device is depicted by box 100. When power is applied, standard power sensing circuitry within the device is able to detect when power has reached a state at which it may be considered within limits and stable, as depicted by the looping path in decision box 105. The circuitry to perform this task is known to those familiar with the art and is discussed, for example, in IEEE 1149.1. Such a step may not be necessary where power stability is reliably achieved with insignificant delay after power up is initiated.

Once power is sensed as being stable, box 110 is entered, wherein a partial test mode is activated, functional mode suspended and test mode reactivation conditions reset. Use of the term "functional mode suspended" is not meant to infer that functional mode was previously explicitly activated, but only that it is now explicitly deactivated or reset. In the partial test mode, device output values are determined only by the interconnect test circuitry including device input CS*. Box 115 is then entered and a nominal delay executed, during which all conditions that might reset test mode are ignored. In the illustrated embodiment, the delay is 10 milliseconds, although longer or shorter delays may be designed into other embodiments and included as a device specification. The purpose of the delay is to allow circuitry external to the device, and perhaps even external to the PCB, time to stabilize when test mode is to be utilized for interconnect or other test purposes. In this example, where the test mode will not be so utilized, the delay specified in box 115 serves no purpose. Following the delay and upon entry into decision box 120, the device is still in test mode, even though, because of the PCB design of this example, it will not be utilized by circuitry external to the memory device. When in test mode, memory device 200 outputs react to device inputs in a predetermined manner, according to the design of the test mode of the device. However, this is of little consequence to functional operation of the PCB because the logical values of the outputs of memory devices are ignored in most PCB designs until after the PCB has stabilized, a period normally longer than the delay of box 115. Therefore, it is unimportant whether the data values present at the memory device outputs are the result of data contained within the functional circuitry of the memory device or according to a test algorithm, reflective onto of input values to the memory device.

Decision box 120 is then entered and the state of inputs which invoke test mode (i.e., a test code) monitored. In the illustrated example method, the code is WE* active (the state of CS* is ignored). Therefore, since the PCB in this example has been designed to avoid spurious writes at power up, the condition of box 120 (test code detected) will not be met and the flow will continue out of the right side of the box, the path marked N. Box 150 will then be entered, wherein test mode will be suspended, functional mode activated and the reactivation condition monitor set to reactivate test mode when reactivation conditions are met. As reactivation conditions were reset in box 110 and could not have been altered in partial test mode, there will be no condition which allows the flow to proceed beyond decision box 160; the only path possible after box 160 is to return to box 150. Thus, the device will unalterably remain in functional mode throughout the power up session.

In the previous example of operation, it has been shown that a device incorporating the present invention and related test mode control apparatus and methods, when mounted on a PCB which has been properly designed to suppress spurious writes immediately after power up, but where utilization of the device test mode is not desired, will behave for practical purposes as if it did not incorporate the test mode functionality usable with the present invention and related test mode control apparatus and methods. This allows mixing devices which incorporate the present invention and related test mode control apparatus and methods with those that do not in populating a PCB.

Figure 1:
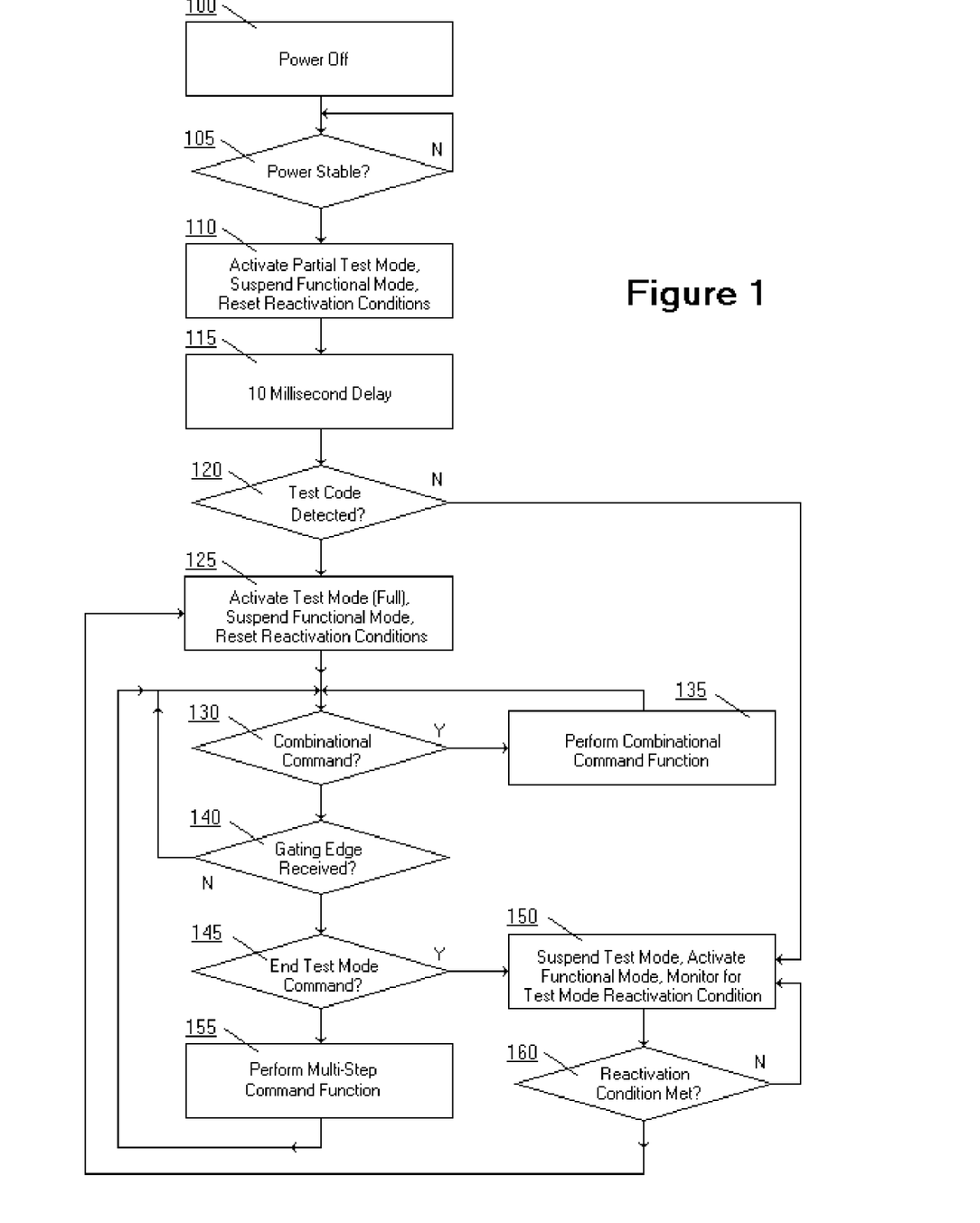
FIG. 1 is a flow chart showing one example method of controlling test mode and of detecting and processing commands according to the present invention and related test mode control apparatus and methods.
Figure 6:
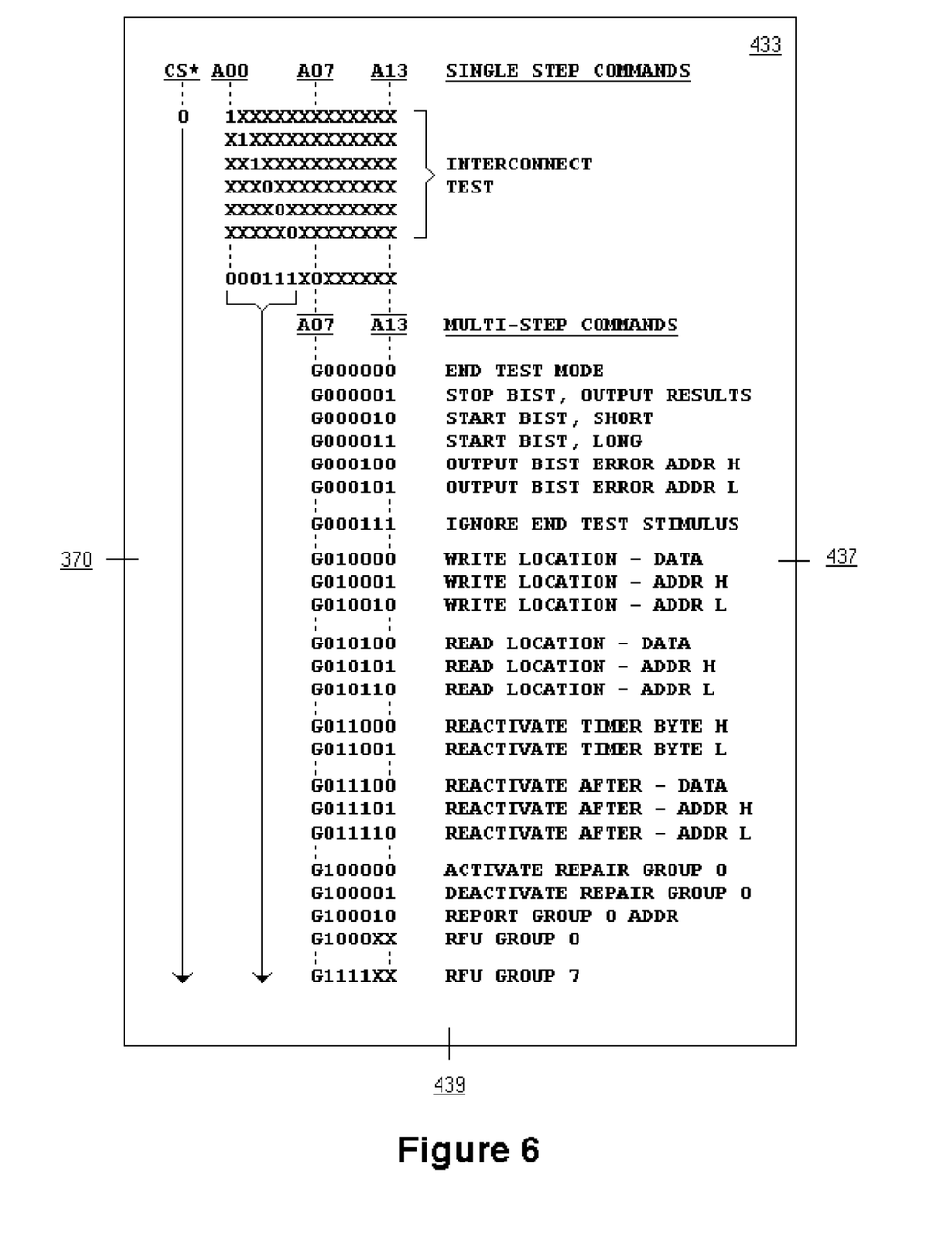
FIG. 6 illustrates operational details of decoder 433 in FIG. 5 according to the teachings of the present invention.

FIG. 1 will now be utilized to explain one method of test mode control and operation of a device incorporating the present invention and related test mode control apparatus and methods included on a PCB which has been designed to take advantage of the test mode of the present invention and related test mode control apparatus and methods insofar as interconnect (continuity) testing is concerned. Starting at box 100, operation will be the same as described in the previous case (test mode not utilized) until box 120 is reached. Then, assuming the proper test code is detected (WE* active) due to proper PCB and/or test design, the flow will continue to box 125. Functional mode already having been suspended and test mode reactivation conditions already reset in box 110, the only action to take place in box 125 will be to enter test mode fully. That is, the test mode limitations previously noted in box 110 are removed. The flow then proceeds to box 130, wherein the device inputs which are used as command inputs are examined. If the instant command is combinational (i.e., single-step), flow continues to box 135, wherein the command is executed. Referring to FIG. 6, it will be seen that device inputs CS* and A00 through A13 are the command input lines and that all input combinations of lines A00 through A13 are used in interconnect testing, except where A00 through A02 each have a logic zero value and A03 through A05 each have a logic one value. Except in that single case, the device output values will be determined by the logic shown in FIG. 5. FIGS. 5 and 6 are discussed in detail below. Even with values of A00 through A05 of 000111 not available for continuity testing, it will be appreciated by those skilled in the art that sufficient combinational values remain to allow comprehensive testing for continuity defects between the various device connections and connections between the device and other devices to which the device may be connected. That is, the values selected will have a relative lack of interference with continuity testing. As noted previously, it is not necessary that all the input combinations used for other than continuity testing cause the outputs to be determined by circuitry other than the continuity test circuitry. In the case of the present example, such was deemed to be the most convenient design choice.

As long as the values presented at device inputs CS* and A00 through A13 equate to combinational commands, the flow from decision box 130 will proceed to box 135, wherein the command is performed (in this case, the device outputs reflecting the device inputs according to the logic of FIG. 5) and then back to box 130. It will be appreciated that some care may be necessary in applying input stimulus such that inputs A00 through A05 are not allowed to have a value of 000111 during the transition from one command to the next. The instantaneous existence of that value might result in misinterpretation of the command inputs as something other than a combinational (i.e., single step) command and cause unintended test operation to occur. Circuitry to avoid such misinterpretation may be included if avoiding such stimulus is deemed too cumbersome for test stimulus preparation.

After completing a desired number of combinational commands, the device test mode is suspended and functional mode activated by means of an END TEST MODE command. As shown in FIG. 6, this is brought about by applying stimulus values 0 to CS* and 000111XG000000 to inputs A00 through A13, respectively, where X is either a logic zero or logic one and G is a logic zero followed by a logic one. That is, considering input stimulus to be a pattern of bits supplied externally, END TEST MODE and other multi-step commands are the result of two distinct patterns, one pattern in which A07 is a logic zero followed by a pattern in which A07 is a logic one and in both of which A00 through A05 have a value of 000111 and A08 through A13 have an unchanging value (000000 in the case of an END TEST MODE command). It is important to note that device 200 outputs remain in a high impedance state and commands are not processed when CS* is a logic one.

Referring again to FIG. 1, the flow was between boxes 130 and 135 during combinational commands. When the END TEST MODE command is presented and A07 is a logic zero, the flow will proceed to decision box 140 and loop between boxes 130 and 140 until A07 changes to a logic one. A07 is designated as the G (gating) bit in FIG. 6 and the transition from logic zero to logic one is the gating edge checked for in decision box 140 (assuming CS* is a logic zero). After the gating edge is detected, the flow proceeds to decision box 145, where it is determined that the non-combinatorial command being processed is an END TEST MODE command, causing a transition from box 145 to 150. The action in boxes 150 and 160 will be the same as in the previous (test mode not utilized) case and the device will revert to functional mode as long as power continues to be applied to the device.

Had the command not been found to be a END TEST MODE command in decision box 145, the flow just discussed would have transitioned to box 155 instead of box 150. In box 155, the command would have been performed. Various such commands are shown in the list of multi-step commands in FIG. 6. They will be discussed in detail as part of an explanation of FIG. 6. However, the five REACTIVATE commands have a unique relationship to the flow of FIG. 1. These commands are used to define situations whereby the device may pass back and forth between test and functional modes.

Presuming functional mode to have been activated on memory device 200 by means of an END TEST MODE command, the flow will be a continuous loop between boxes 150 and 160 as described above. However, when a Test Mode Reactivation Condition is met through monitoring in box 150, the flow from decision box 160 will then be to box 125, suspending functional mode and reactivating test mode. Reactivating test mode in box 125 also resets the REACTIVATION conditions that may have been previously set as discussed herein.

The illustrated embodiment will now be described with reference to FIGS. 3, 4 and 5.

FIG. 3 illustrates in greater detail the memory device of FIG. 2. As shown, device 200 has inputs 370. Inputs 370 are connected to circuit 310, which includes a power sensor, a 10 millisecond timer, monitor circuits and control circuits which control both the overall operating mode (test or functional) and other circuitry of the present invention and related test mode control apparatus and methods. The principal function of the control circuitry of circuit 310 is as a mode controller. The connections to VDD and VSS used in powering circuit 310 and as inputs to the power sensor section of circuit 310 are not shown. Circuit 310 connects to drivers and multiplexers circuit 350 by means of lines 311. Lines 311 are used to control the selection of test circuit outputs (via lines 331) or functional circuit outputs (via lines 341) as inputs to the device drivers contained within block 350 and to control the strength of device 200 drivers. The strength may optionally be reduced when memory device 200 is operating in test mode. This strength control should not be confused with the control means by which driver outputs assume a high impedance state. Lines 360 connect the data output drivers of block 350 to the external data output connections of memory device 200. Also shown in FIG. 3 are test circuits 330 and functional circuits 340, which are each connected to the device inputs via lines 370. Lines 312 and lines 342 are used for control and data transfer between control circuits 310, test circuits 330 and functional circuits 340.

Figure 4:
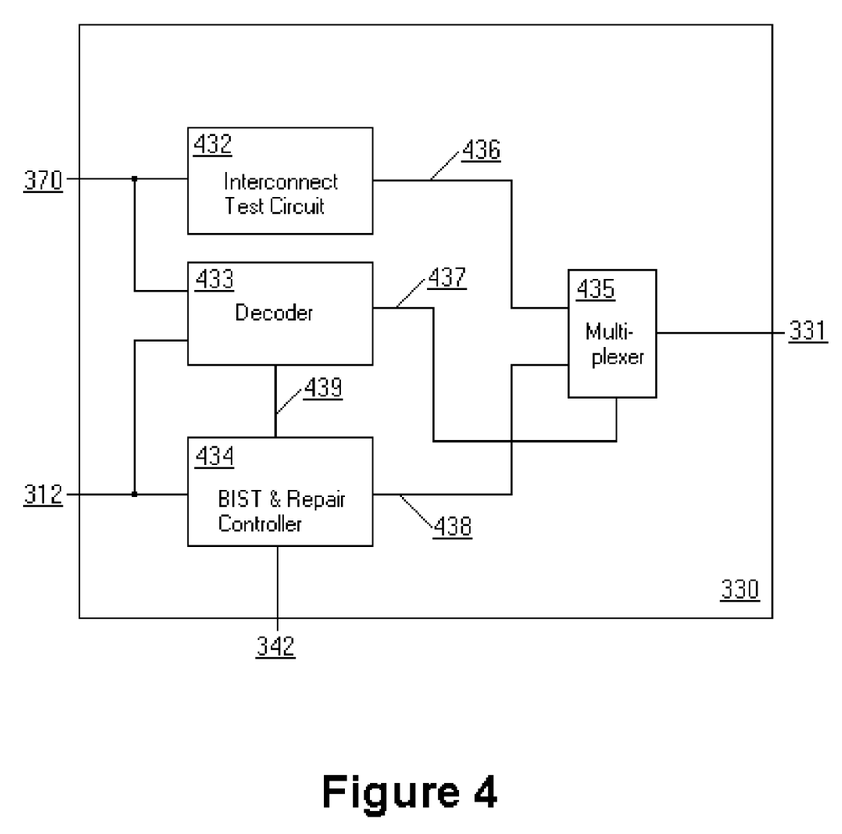
FIG. 4 is a block diagram showing details of test circuitry 330 in FIG. 3.

FIG. 4 shows in greater detail test circuit 330 of device 200. Device 200 inputs 370 are connected to the inputs of interconnect test circuit 432, the outputs of which are connected to the data inputs of multiplexer 435 via lines 436. Inputs 370 are also connected to decoder 433, certain outputs of which are connected to BIST and repair controller 434 via lines 439. Another output of decoder 433 is connected to the select input of multiplexer 435 via line 437. BIST and repair controller 434 provides outputs to data inputs of multiplexer 435 via lines 438 and is connected to controller 310 via lines 312 and functional circuit 340 via lines 342. Lines 312 and 342 are also used to connect control circuit 310 to functional circuit 340 through controller 434. Decoder 433 is connected to controller 310 by lines 312.

FIG. 5 shows in greater detail interconnect test circuit 432 of test circuit 330. Device address and data input lines A00 through A13 and DI0 through DI7, a subset of device inputs 370, are connected to the inputs of XOR and inverter gating circuits within circuit 432. Data lines DI1 through DI7 are individually connected through inverters, becoming outputs DO1 through DO7, respectively. The remaining inputs, A00 through A13 and DI0 are connected to the inputs of an XOR gate, the output of which is DO0. DO0 through DO7 are connected to lines 436. Thus, the logic values output on lines 436 are be determined by considering the logic values on the input lines 370 connected to the gating circuits and the functionality of the gating circuits. For example, if the logic values input on lines A00 through A13 and DI0 through DI7 were 1010101010101010101010, respectively, the logic values output on lines DO0 through DO7 would be 01010101, respectively.

FIG. 6 illustrates functions of the decoder test circuitry that may be controlled by means of control, address and data input lines to device 200: CS*, A00 through A13 and DI0 through DI7. Each function is considered a command. Controller 310 determines whether device 200 operates in test mode or functional mode. When in test mode, the outputs of test circuitry 330 are connected through lines 331 to drivers and multiplexer circuit 350 and in turn to device 200 data outputs through lines 360. Controller 310 controls the connection path over lines 311. Lines 311 may also be used to cause the drivers to operate at reduced strength during test mode, the choice to do so or not having been made at the time of designing device 200. Using line 437, decoder 433 causes multiplexer 435 to pass the outputs of interconnect test circuit 432 from lines 436 to lines 331 whenever a command listed under the heading of single step commands in FIG. 6 is present on lines 370. For other commands, decoder 433 sets line 437 to the opposite value, causing multiplexer 435 to pass the outputs of BIST and repair controller 434 from lines 438 to lines 331. For single step commands, then, the outputs of device 200 are reflective of the inputs of device 200 as controlled by the gating circuits of interconnect test circuit 432. In this manner, an IEEE P1581 test may be conducted of connections external to device 200.

The multi-step commands of FIG. 6 are more complex, but in all cases the outputs of BIST and repair controller 434 are passed through to the device 200 outputs as described above. The same path is used for undefined commands (e.g., those listed as RFU—reserved for future use) and for commands where no data needs to be output (e.g., END TEST MODE). In the case where no data needs to be output, decoder 433 causes controller 434 to output logic zero values on lines 438. For each multi-step command, the output states of decoder 433 are utilized only when line A07 of lines 370 transitions from a logic zero to a logic one and CS* is a logic zero. That is, lines A07 and CS* are connected to two of the group of lines 439 connected to controller 434 and in turn connected to two of the group of lines 312 which connect to controller 310.

When the END TEST MODE command occurs, a signal from decoder 433 to controller 310 (using a path parallel to the one of A07, noted above) causes the actions of box 150 in FIG. 1 to occur. That is, controller 310 suspends test mode, activates functional mode and monitors for a test mode reactivation condition, described below. If the reactivation condition occurs, controller 310 causes the actions of box 125 of FIG. 1 to occur, including reactivating test mode.

Reactivation of test mode occurs if device 200 is operating in functional mode and either a defined time has elapsed since functional mode was activated (or reactivated) or predetermined data is written into a predetermined memory address. Circuitry supporting both reactivation methods (time and data/address) is included in decoder 433. The circuitry may, for example, include three eight bit registers, one for each of the three REACTIVATE AFTER commands shown in FIG. 6 and two parallel loadable eight bit counters, one for each of the two REACTIVATE TIMER commands shown in FIG. 6. Each command causes its respective register or counter to be loaded with the values present on lines DI0 through DI7, respectively. Additionally, the REACTIVATE TIMER BYTE H and REACTIVATE AFTER—DATA commands also may, for example, set single bit storage elements included in decoder 433 (e.g., two flip-flops) used to indicate the registers or counters have been loaded and that reactivation is allowed.

The storage elements, registers and counters are reset at the beginning of each period of test mode activity by means of a signal passed from controller 310 to decoder 433 over one of the group of lines 312. A signal is similarly passed from controller 310 to decoder 433 at the beginning of each period of functional mode activity. Upon receipt of this latter signal and if the single bit storage element associated with the reactivation timer counter indicates the counter was loaded during test mode, circuitry also contained in decoder 433 will cause it to decrement at a rate of one count in 10 milliseconds, thus taking up to slightly longer than 160 seconds to decrement to zero in the case where all 16 counter bits were loaded to one during test mode. When the both counters are at zero and the single bit storage element indicates they were loaded while in test mode, decoder 433 activates another one of the group of lines 312 that will signal controller 310 that a reactivation condition has been met and the actions of box 125 of FIG. 1 are to be performed. For REACTIVATE AFTER commands, the values held in the three registers are compared with the respective values present on A00 through A13 and DI0 through DI7 (unused register bits are ignored and CS* is checked to be a logic zero) and the last mentioned line of the group of lines 312 used to signal controller 310 that a reactivation condition has been met if all bits compare and the single bit storage element associated with a certain one of the registers indicates it was loaded while in test mode.

Provision is also made for decoding commands to read and write locations of the functional memory while memory device 200 is operation in test mode. These commands are shown as, respectively, READ LOCATION and WRITE LOCATION groups in FIG. 6.

Provision is also made for decoding commands supporting self repair functionality. As noted previously, the test circuitry includes eight groups, each having 64 locations which may be used to substitute for defective sections of the functional memory in 340. The portion of functional memory for which substitution will be made is defined by the eight uppermost address bits of the group of 64 locations, corresponding to device 200 address inputs A00 through A07. Thus, if for example, the third group of self repair locations were to be substituted for memory locations with the address range 00110010000000 through 00110010111111, the address specified for repair group 3 would be 00110010. Referring to FIG. 6, the ACTIVATE REPAIR GROUP commands utilize the eight data inputs to memory device 200 to specify which area of functional memory will be logically replaced during both test and functional operations. The DEACTIVATE REPAIR GROUP commands disable the replacement function for its designated group. The REPORT GROUP commands cause the stored value of address substitution for a respective group to be output on memory device 200 outputs. The RFU (reserved for future use) commands might, for example be utilized to externally determine which repair groups were activated or deactivated. Self repair circuitry is well known in the art and is described herein only to illustrate the operation of one such circuit as may be used in the illustrated embodiment of the present invention and related test mode control apparatus and methods.

The IGNORE END TEST STIMULUS command shown in FIG. 6 allows some features of the present invention and related test mode control apparatus and methods to be more practical for use where test mode is otherwise deactivated when memory device 200 is presented with certain external stimulus. For example, in the cross referenced application, test mode is deactivated when CE* and WE* are simultaneously asserted. Execution of the IGNORE END TEST STIMULUS command invokes circuitry to cause the circuitry which monitors CE* and WE* to be isolated from the circuitry which would cause test mode deactivation. Therefore, a device so designed would be able to utilize more features of the present invention and related test mode control apparatus and methods than would otherwise be possible. For example, a memory device incorporating certain features of the present invention and related test mode control apparatus and methods including the ability to deactivate and subsequently reactivate test mode without restricting WE* and CE* activity in the interim would be possible.

Figure 7:
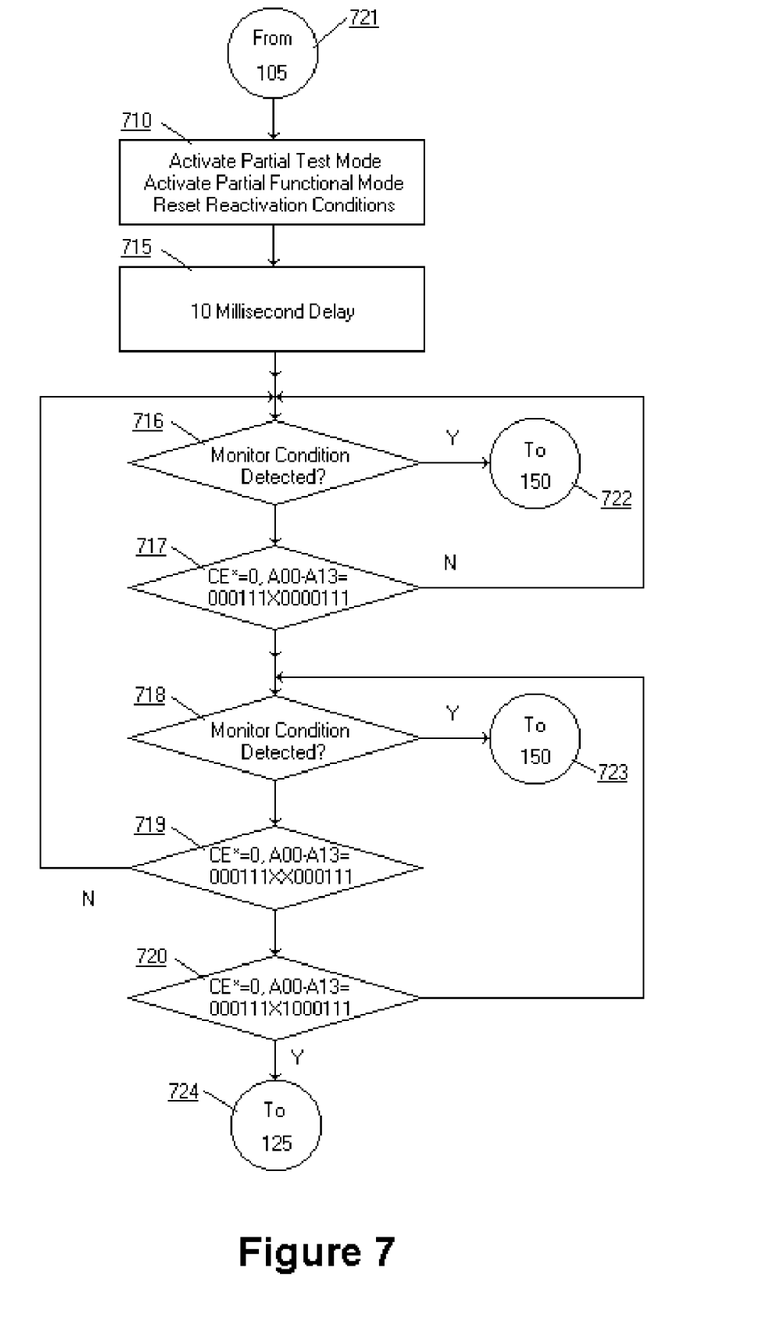
FIG. 7 is a flow chart showing the method of the present invention and related test mode control apparatus and methods when used, for example, in conjunction with the invention of the referenced related patent application.

FIG. 7 illustrates operation of a memory device incorporating selected features of the present invention and related test mode control apparatus and methods, where test mode deactivation which normally occurs when the memory device is presented with certain external stimulus such as, for example, CE* and WE* in the invention of the referenced related patent application, may be overridden using an IGNORE END TEST STIMULUS command. As shown, activity box 710 occurs in lieu of box 110 in FIG. 1. In the case of the referenced related patent application, for example, functional mode is not completely suspended allowing for proper completion of any write command occurring during test mode (and immediately deactivating test mode). Decision boxes 716 and 717, although drawn serially for clarity, occur simultaneously. Similarly, decision boxes 718, 719 and 720 occur simultaneously. After the 10 millisecond delay of box 715, looping will occur between decision boxes 716 and 717 unless the condition to deactivate test mode is detected through monitoring (e.g., WE* and CE*) or the values present on memory device 200 address inputs A00 through A13 become 000111X0000111, in conjunction with CE*=0. During this looping, device outputs will be controlled by interconnect test circuitry 432, in conjunction with CE*. If the monitor condition is detected the flow proceeds to box 150 of FIG. 1. If A00 through A13 become 000111X0000111, in conjunction with CE*=0, loop 718 through 720 is entered. Looping will continue unless the condition to deactivate test mode is detected, A00 through A13 become unequal to 000111XX000111 (or CE*=1) or A00 through A13 become equal to 000111X1000111, in conjunction with CE*=0. In the first case, flow proceeds to box 150 of FIG. 1 (suspending test mode); in the second case, the loop of decision boxes 716 and 717 is re-entered; in the third case flow proceeds to box 125 of FIG. 1, whereby monitor condition detection will no longer effect the flow.

Figure 8:
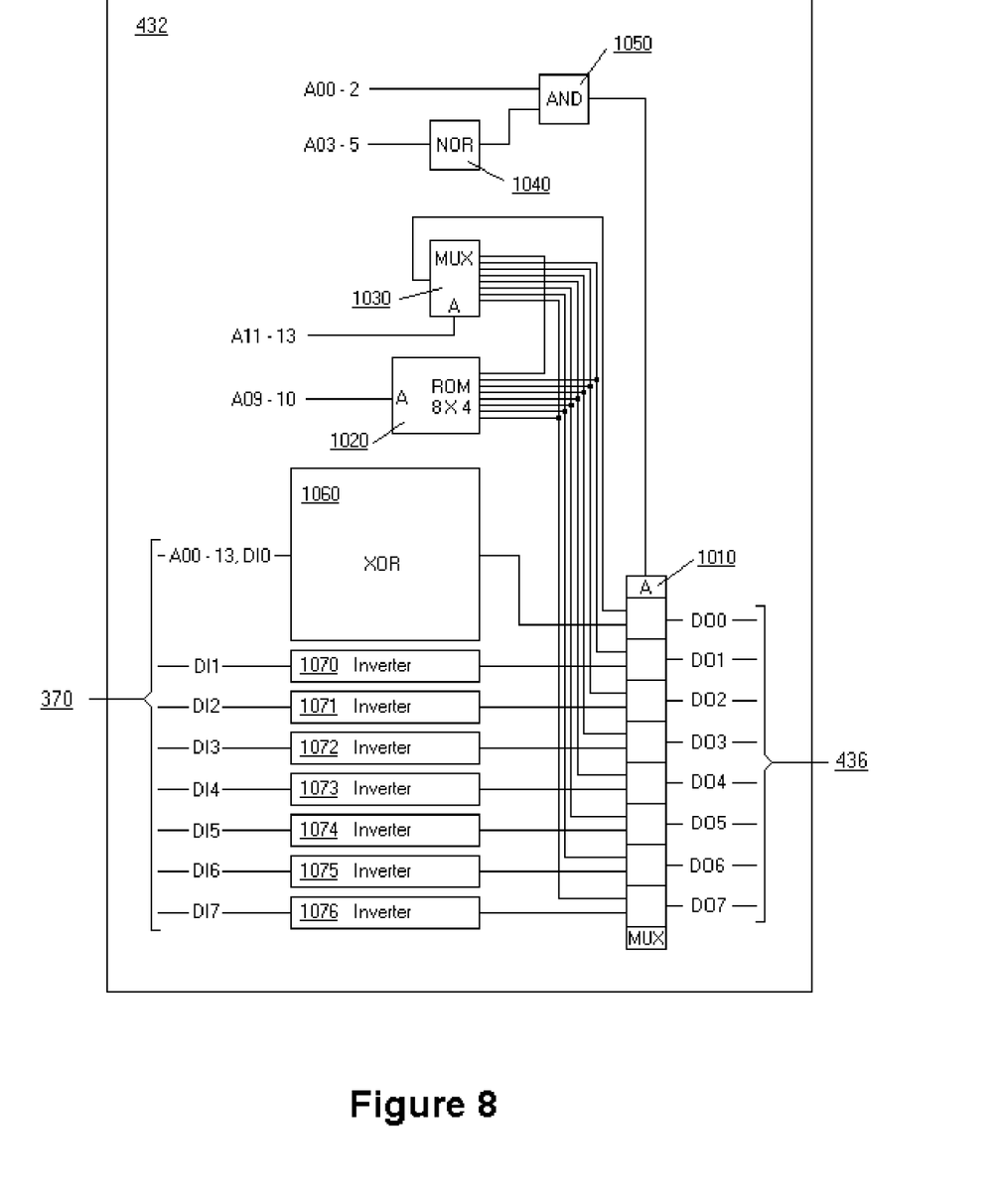
FIG. 8 is a block diagram showing details of interconnect test circuit 432 of FIG. 4 to which has been added the capability of reading pre-stored data.

FIG. 8 shows the interconnect test circuitry 432 to which the capability of reading pre-stored data has been added. Such capability is carried out by the circuits of blocks 1010 through 1050. In the illustrated embodiment pre-stored data could, for example, include codes to represent the manufacturer, part number and revision of the device as utilized by the "device identification register" of IEEE 1149.1. While the capability of reading from registers has already been described as part of the present invention and related test mode control apparatus and methods (e.g., the REPORT GROUP 0 ADDR multi-step command) and registers having pre-stored data are not a significant departure from those having data stored during device operation, the added capability provided by the circuitry of FIG. 8 is an alternative that may be of great benefit when, for example, the device designer determines not to include the functions supported by multi-step commands.

Operation of the circuitry of FIG. 8 will now be described. Multiplexer 1010 is an 8 section 2 to 1 device. When a logic zero is applied to its A input, the outputs of XOR 1060 and inverters 1070 through 1076 are selected for application to DO0 through DO7, respectively, of lines 436. Thus, logic values on output lines 436 will reflect logic values on input lines 370 in the manner previously described for FIG. 5. However, when logic values 111000 are applied to device address inputs A00 through A05, respectively, 3 input NOR gate, having inputs A03 through A05, will output a logic one and 4 input AND gate 1050, having inputs A00 through A02 and the output of NOR gate 1040 will, in turn, output a logic one. Since the output of AND gate 1050 drives the A input of multiplexer 1010, the outputs of multiplexer 1010 will reflect the logic values applied from seven of the eight outputs of ROM 1020 and the output of multiplexer 1030.

All eight outputs of ROM 1020 are connected to the inputs of multiplexer 1030, thus allowing the logic value from any of the eight outputs of ROM 1020 to be applied to the DO0 lines of lines 436, the one of which eight outputs is selected by the address value applied to the three address inputs of multiplexer 1030, i.e., device address inputs A11 through A13. ROM 1020 contains four locations of eight bits each, addressable by two address inputs A, driven by device inputs A09 and A10. Thus, it will be seen by one skilled in the art that the application of predetermined logic values to device address inputs A00 through A05 and A09 through A13 will allow the contents of ROM 1020 to be applied as an output on lines 436, either byte by byte on lines DO0 through DO7 in four operations or bit by bit on line DO0 in 32 operations.

The configuration of device input bits used in controlling reading operations in devices similar to the one shown in FIG. 8 can be expressed as CCCCCCWWWBBbbb, where CCCCCC is a predetermined configuration of six bits which are used to select the reading circuitry instead of continuity test gates 1060 and 1071 through 1076. The code 111000 was selected because it allows all address bit combinations which include one or two ones or one or two zeroes to be applied as continuity tests. The plurality of single bit combinations are what make up either "walking one" or "walking zero" test, each a commonly used and highly regarded basic test. The ability to employ double one or double zero tests affords more flexibility for the test designer or test design system in choosing test patterns. However, many designers might consider that there is little advantage in the increased flexibility. But, for those that want such flexibility and are willing to include the necessary circuitry for a relatively complex decoding scheme, it is often possible to use only codes in which half of the address bits are ones and half zeroes (or the next integer above or below half in the case of an odd number of address bits. For example, with 14 address bits there are over three thousand address combinations having seven ones and seven zeroes, more than enough than the number needed to control the reading operations of the circuitry of FIG. 8 (4 reads of one byte at a time and 32 reads of one bit at a time). While it is possible to utilize data input bits in addition to or in lieu of address bits, there is sometimes a disadvantage in using more than one data bit. This may occur, for example, where only one data bit of a memory device is connected external to the device such as where a memory word of 128 data bits plus 9 error detection and correction (EDAC) bits was stored in a bank of 8 bit memory devices. In that case, the designer could employ 18 of the same 8 bit devices, utilizing the full capacity of 17 devices and only one bit for the 18th. In the circuitry of FIG. 8, multiplexer 1030 allows all pre-stored data to be read from a single external device data connection, requiring only that the board designer ensure that such single connection is wired on the board even when one or more other device external data connections are not so wired.

In relation to the circuitry of FIG. 4, bits WWW of the address input bit configuration might be used to select, for example, among eight groups of four byte words in a ROM similar to ROM 1020. In that case, A06 through A08 would be connected to ROM address inputs in addition to A09 and A10. Bits BB relate to selection of individual bytes and bits bbb relate to selection of individual bits.

From the above, it is seen that one skilled in the art will be able to employ 32 bit ROM 1020 for the same purpose as the device identification register mandated in the IEEE 1149.1 standard. That is, data read from ROM 1020, regardless of its distribution within ROM 1020 may be remapped, if necessary, and examined, for example, by equipment directly (as with an in-circuit tester through directly connected test probes) or indirectly (as with a boundary scan tester). Also, one skilled in the art may employ the methodology of the present invention and related test mode control apparatus and methods for externally reading of other data from within the memory device.

From the above it is seen that the present invention and related test mode control apparatus and methods provides a number of advantages over prior methods of PCB testing. For example, no extra connections to the memory device are required beyond those necessary to carry out the normal functional operation of the memory device. A further example is that no special input signal combination codes are required beyond those necessary to carry out the normal functional operation of the memory device. A still further example of the advantages of the present invention and related test mode control apparatus and methods is that the dual mode operation of the device creates little difference from operation of a device of equivalent functionality, but without the circuitry of the present invention and related test mode control apparatus and methods. Thus, the dual mode operation of the present invention and related test mode control apparatus and methods is available to users who want to utilize the test features of the present invention and related test mode control apparatus and methods or is essentially transparent to users who may not only be uninterested in utilizing the test mode, but unwilling to incorporate more than minimal, if any, special circuitry external to the device to avoid the effects of activating test mode in devices incorporating the present invention and related test mode control apparatus and methods.

It should be noted that, although the illustrated embodiment contains circuitry for (1) continuity testing, (2) device identification, (3) BIST and (4) self-repair, a device containing continuity testing and any one or more of these other features could be constructed utilizing the teachings of the present invention. It should also be noted that, although the illustrated embodiment has been described largely in conjunction with a given test mode control method (the one detailed in FIG. 1), operation with any test mode control method can easily be achieved by one skilled in the art. That is, the present invention is directed to device operation once test mode has been established and not to methods of establishing the test mode of operation. Reference to specific methods of achieving the test mode of operation are made purely for illustrative purposes only.

While a block diagram approach has been used to describe the present invention and related test mode control apparatus and methods, it will be apparent to those skilled in the art as to the specific circuits required to perform the functions contained within the illustrated blocks.

In cases where an extra device connection is considered tolerable, the present invention and related test mode control apparatus and methods may be adapted for such use. For example, the power sense, timer and monitor section may be replaced by circuitry that monitors the extra connection. In such a design, the device would operate in test mode when the connection was externally driven to one binary state and operate in functional mode when driven to the opposite binary state. The same decoding technique as used in the illustrated embodiment of the present invention and related test mode control apparatus and methods would be utilized to select any combination of (1) a connectivity test capability, (2) device identification capability feature, (3) a BIST capability and (4) a self-repair capability. Even more test capabilities, not specified herein, could be selected using the same decoding technique. In cases where it is desired to avoid dedicated external circuitry to drive the extra device connection controlling the test mode, it may be driven by an unused output of an external boundary scan device. In such a case, test mode selection might require both a given level at the extra connection and a certain code, codes or coded sequences be applied to other inputs of the device utilizing the principles of the present invention and related test mode control apparatus and methods.

It will be apparent to those skilled in the art that memory devices designed according to the present invention and related test mode control apparatus and methods may be used to benefit in testing of memory modules connected to other modules such as, for example, mother boards of personal computers. It will also be apparent to those skilled in the art that the command structure illustrated in FIG. 6 may be replaced with one that uses fewer combinations of input signals than would otherwise be available for interconnect testing, such as by increasing the number of steps required for multi-step commands. It will further be apparent to those skilled in the art that other commands may be included in the present invention and related test mode control apparatus and methods. An example of such a command is one which would reset reactivation conditions to prevent reactivation of test mode during subsequent functional operations. Another example of such a command is one that would prevent reactivation of test mode during subsequent functional operations except when a reactivation condition is met within a defined time period. It will even further be apparent to those skilled in the art that the method of the present invention and related test mode control apparatus and methods is applicable to other devices, for example, memories in which addresses or data are presented to the memory devices in time multiplexed groups, as opposed to all at once as discussed herein.

The invention claimed is:

1. Apparatus of an electronic device for carrying out a test mode of operation and a functional mode of operation of the electronic device wherein the test mode of operation has already been established and wherein the apparatus of the device includes a number of device digital functional input and output connections, functional circuitry for carrying out a functional mode of operation and test circuitry for carrying out externally conducted continuity test operations, the test circuitry including exclusively combinational logic coupling between a number of the digital functional inputs and outputs, control circuitry for switching between the test and functional modes of operation, output circuitry for selectively applying outputs of either the test circuitry or the functional circuitry to digital functional output connections, the apparatus further comprising:
   (a) test circuitry having functionality for performing both continuity testing and any one of a number of other test functions, wherein a plurality of the number of digital functional input connections used in continuity testing are also used in the any one of the number of other test functions;
   (b) mode control circuitry included in the test circuitry for switching between the test and functional modes of operation; and,
   (c) control circuitry included in the test circuitry operatively coupled to the functional circuitry and the test circuitry, to control functional and test operations in direct response to combinations of signals superfluous to performing continuity testing that are applied to the plurality of the number of digital functional inputs.

2. The apparatus of claim 1 wherein the test circuitry includes circuitry for performing continuity testing and the any one of the number of other test functions includes device identification, built in self testing and self repair.

3. The apparatus of claim 1 wherein the test control circuitry further includes apparatus for processing any one of a number of commands defined by the superfluous combinations of input signals detected by the detecting circuitry, the number of commands including commands to switch to functional mode, to prevent switching to functional mode except by command, to write or read functional memory locations, to set up conditions for reactivation or to perform self repair actions.

4. A method of operating an electronic device, the electronic device having a number of inputs and outputs including a number of digital functional inputs and outputs, a test mode of operation and a functional mode of operation, wherein circuitry for the test mode of operation includes combinational continuity test circuitry for externally conducting continuity tests of connections between connections of the digital functional inputs and digital functional outputs of the electronic device and input and output connections of other electronic devices to which the electronic device connects and wherein the continuity test circuitry within the electronic device operatively coupling at least a majority of the digital functional inputs to digital functional outputs of the electronic device is combinational logic, the electronic device further including functional circuitry for carrying out the functional mode of operation, control circuitry for switching between the test and functional modes of operation and output circuitry for selectively applying outputs of the test circuitry and the functional circuitry to digital functional outputs of the electronic device, the method comprising the steps of:
   (a) providing stimulus at one or more device inputs causing detecting and decoding circuitry coupled to one or more device inputs to select between the test mode of operation and the functional mode of operation;
   (b) providing stimulus at a plurality of the digital functional inputs of the electronic device causing other detecting and decoding circuitry coupled to those digital functional inputs of the electronic device to detect and decode as one or more commands for conducting other tests, one or more combinations which have been categorized as superfluous to conducting practical continuity testing of operatively coupled input signals applied concurrently to the digital functional inputs by the other electronic devices;
   (c) activating other testing circuitry coupled to the detecting and decoding circuitry and active during the test mode of operation to carry out the other tests in response to the commands detected and decoded; and,
   (d) activating circuitry coupled to the other detecting and decoding circuitry for selecting outputs of the other testing circuitry as outputs of the test circuitry when the other tests are active and in the absence of the other tests being active, selecting outputs of the combinational continuity testing circuitry for conducting continuity testing.

5. Apparatus included in an electronic device, the electronic device having a number of inputs and outputs including a number of digital functional inputs and outputs, a test mode of operation and a functional mode of operation, wherein circuitry for the test mode of operation includes combinational continuity test circuitry for externally conducting continuity tests of connections between connections of the digital functional inputs and digital functional outputs of the electronic device and input and output connections of other electronic devices to which the electronic device connects and wherein the continuity testing circuitry within the electronic device operatively coupling at least a majority of the digital functional inputs to digital functional outputs of the electronic device is combinational logic, the electronic device further including functional circuitry for carrying out the functional mode of operation, control circuitry for switching between the test and functional modes of operation and output circuitry for selectively applying outputs of the test circuitry and the functional circuitry to the digital functional outputs of the electronic device, the apparatus comprising:
   (a) detecting and decoding circuitry coupled to one or more device inputs to select between the test mode of operation and the functional mode of operation;
   (b) other detecting and decoding circuitry coupled to the digital functional inputs of the electronic device for detecting and decoding as one or more commands for conducting other tests, one or more combinations which have been categorized as superfluous to conducting practical continuity testing of operatively coupled input signals applied concurrently to the digital functional inputs by the other electronic devices;

(c) other testing circuitry coupled to the detecting and decoding circuitry and active during the test mode of operation to carry out the other tests in response to the commands detected and decoded; and, (d) circuitry coupled to the other detecting and decoding circuitry for selecting outputs of the other testing circuitry as outputs of the test circuitry when the other tests are active and in the absence of the other tests being active, the circuitry selecting outputs of the combinational continuity testing circuitry for conducting continuity testing.

6. The apparatus of claim 5 wherein the electronic device is an electronic memory device.

7. The apparatus of claim 5 wherein the combinations of operatively coupled input signals applied to the digital functional input connections that are not to be used as commands but are to be used for conducting continuity testing include the following: a combination of all inputs set to logic zero, a combination of all inputs set to logic one, any combination of all inputs set to logic zero except for any one input set to logic one and any combination of all inputs set to logic one except for any one input set to logic zero.

8. The apparatus of claim 5 wherein the combinations of operatively coupled input signals applied to the digital functional input connections that are not to be used as commands but are to be used for conducting continuity testing include the following: a combination of all inputs set to logic zero, a combination of all inputs set to logic one, any combination of all inputs set to logic zero except for any predetermined fixed number of inputs not to exceed half of all the inputs set to logic one and any combination of all inputs set to logic one except for any predetermined fixed number of inputs not to exceed half of all the inputs set to logic zero.

9. The apparatus of claim 5 wherein the testing circuitry which carries out the other tests further includes device identification circuitry.

10. The apparatus of claim 5 wherein the testing circuitry which carries out the other tests further includes built in self test circuitry.

11. The apparatus of claim 5 wherein the testing circuitry which carries out the other tests further includes self repair circuitry.

12. The apparatus of claim 5 wherein the operatively coupled combinational logic continuity test circuitry conforms to the Proposed IEEE P1581 Architecture.

13. Apparatus included in an electronic device conforming to a form of the Proposed IEEE P1581 Architecture that supports only continuity testing, the apparatus comprising:

(a) detecting and decoding circuitry coupled to digital functional input connections of the electronic device for detecting and decoding one or more of the combinations of operatively coupled input signals applied to the digital functional inputs of the electronic device, the one or more combinations being categorized as superfluous to conducting continuity testing applied to the device digital functional input connections as one or more commands for performing other tests;

(b) other testing circuitry coupled to the detecting and decoding circuitry and active during the test mode of operation to carry out the other tests in response to the combinations of operatively coupled input signals detected and decoded as commands by the detecting and decoding circuitry; and, (c) circuitry responsive to signals from the detecting and decoding circuitry to selectively apply outputs of the continuity test circuitry or the other test circuitry to the outputs of the device during test mode.

14. The apparatus of claim 13 wherein the electronic device further includes a single external dedicated test pin connection and wherein the test mode of operation is invoked and selected by one logic state of the single external dedicated test pin connection of the electronic device.

15. The apparatus of claim 13 wherein the electronic device further includes one or more external non-dedicated test connections which may be used to invoke the test mode of operation and wherein the test mode of operation of the electronic device is invoked using signals received at the one or more external non-dedicated test connections of the electronic device, corresponding to analog input connections.

16. The apparatus of claim 13 wherein the other testing circuitry includes circuitry to support device identification, built in self test, or self repair features.

* * * * *